(12) United States Patent
Gruetter et al.

(10) Patent No.: US 8,368,379 B2
(45) Date of Patent: Feb. 5, 2013

(54) APPARATUS AND METHOD FOR MONITORING OUTPUT WITHIN A POWER STRIP

(75) Inventors: David Richard Gruetter, Fullerton, CA (US); Kenson Tamotsu Harada, Laguna Niguel, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 507 days.

(21) Appl. No.: 12/717,851

(22) Filed: Mar. 4, 2010

(65) Prior Publication Data
US 2011/0215794 A1 Sep. 8, 2011

(51) Int. Cl.
G01R 19/00 (2006.01)
H02B 1/00 (2006.01)

(52) U.S. Cl. ..................... 324/76.11; 361/601
(58) Field of Classification Search .............. 324/76.11; 327/82, 276, 306; 361/601, 605, 622, 631, 361/641, 643; 439/108, 152, 607.15, 851
See application file for complete search history.

(56) References Cited

U.S. PATENT DOCUMENTS

| | | | |
|---|---|---|---|
| 5,343,165 A * | 8/1994 | Kordts et al. | 330/262 |
| 5,381,054 A * | 1/1995 | Standley | 327/82 |
| 2009/0051399 A1* | 2/2009 | Frambach | 327/276 |
| 2009/0181565 A1* | 7/2009 | Rubin et al. | 439/108 |
| 2009/0206906 A1* | 8/2009 | Kervaon et al. | 327/306 |
| 2010/0214109 A1* | 8/2010 | Reynolds et al. | 340/664 |
| 2010/0258682 A1* | 10/2010 | Fries et al. | 246/1 C |

\* cited by examiner

Primary Examiner — Hoai-An D Nguyen

(57) ABSTRACT

The present disclosure describes a PDU configured to reduce the risk of an abrupt interruption in the flow of electricity caused by a malfunctioning load or overloading of a PDU output connection. In some embodiments, a PDU is configured to enable the monitoring and control of electricity provided to one or more loads coupled to the PDU. In some embodiments, a PDU is configured to enable remote monitoring and reporting through the use of communication devices.

19 Claims, 11 Drawing Sheets

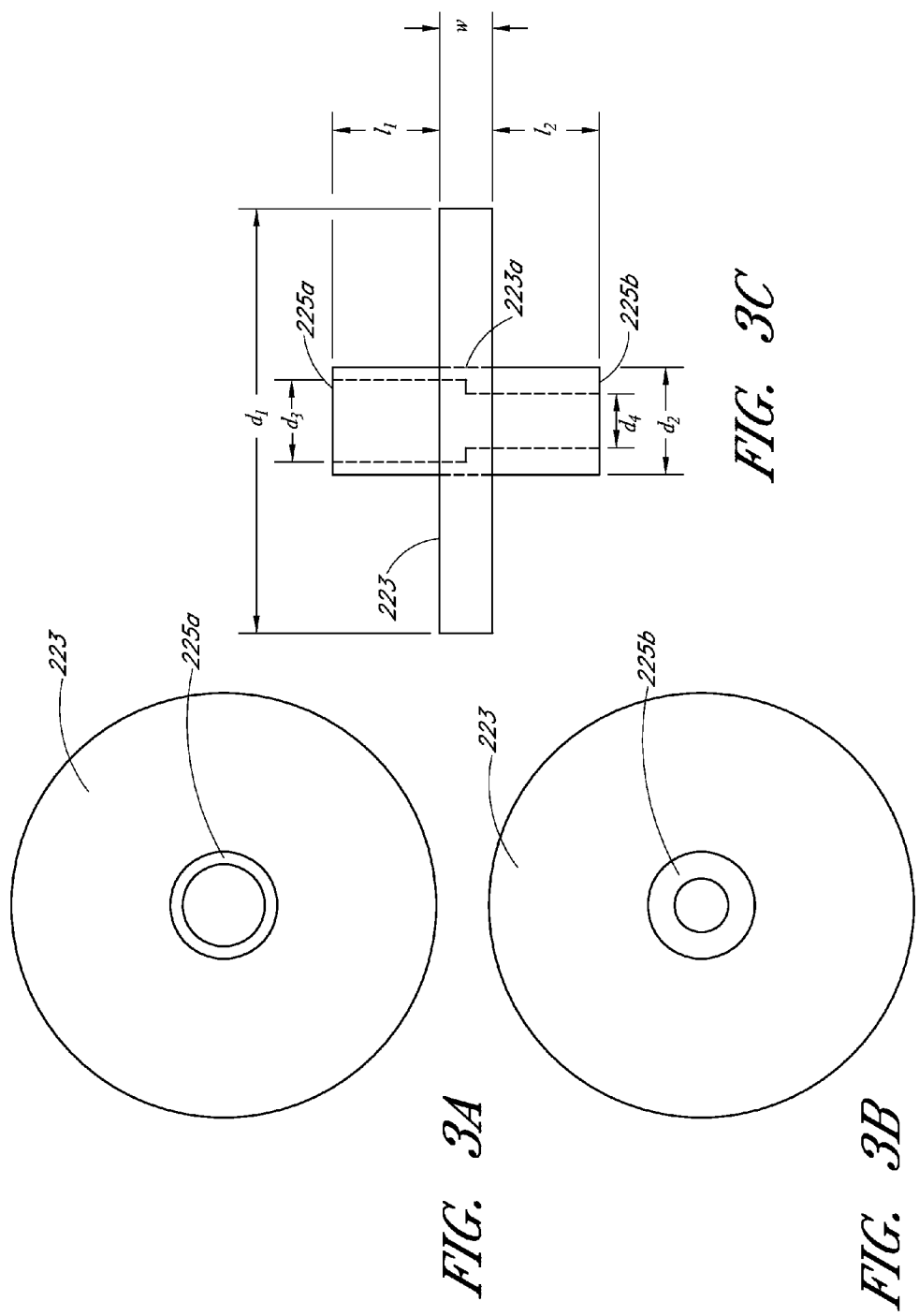

APPARATUS AND METHOD FOR MONITORING OUTPUT WITHIN A POWER STRIP

FIELD OF THE INVENTION

The present invention relates to the field of electricity distribution and measurement.

BACKGROUND

Electricity is a primary energy source used in residential and commercial applications. Determining electricity use is important for managing electricity distribution networks (e.g. power grids). Server clusters for example, which are also known as data centers and colloquially as "server farms", consume vast amounts of electricity. A server cluster is a collection of computing resources typically including a number of server computers, network routers and switches maintained at a common facility. Server clusters are used for applications such as web hosting, off-site data storage, cluster computing, and cloud computing. Server clusters also serve as the physical architecture for search engines and data exchanges for email and data services.

Electricity to server clusters is generally supplied as alternating current over power lines. The power lines are connected to a facility housing the server computers and associated supporting devices. Within a facility, the electricity is typically supplied to one or more distribution circuits through a fuse box or respective circuit breakers. One or more power distribution units (PDUs) are coupled to each distribution circuit. A PDU typically includes one electrical input for receiving electricity, and two or more electrical outputs for providing electricity to other devices. Typically a number of server computers or other current drawing devices are coupled to each PDU in order to receive electricity.

SUMMARY OF THE INVENTION

The present disclosure describes a PDU configured to reduce the risk of an abrupt interruption in the flow of electricity caused by a malfunctioning load coupled to the PDU. In some embodiments, a PDU is configured to enable the monitoring and control of electricity provided to one or more loads coupled to the PDU. In an embodiment, the load coupled to each outlet of the PDU is measured. The measured load information can be used to prevent overloading a single outlet of the PDU or to determine whether or not a load is malfunctioning.

In some embodiments, a radial current splitter is configured to enable the individual and/or simultaneous measurement of one or more outputs of a PDU. In some embodiments, a radial current splitter substantially reduces the electromagnetic or electrical crosstalk (herein collectively referred to as crosstalk) within at least a portion of the PDU. In some embodiments, the radial current splitter enables the individual and simultaneous measurement of respective currents drawn from electrical output connections of a PDU. In some embodiments, the radial current splitter enables the individual and simultaneous measurement of the respective voltage levels at electrical output connections of the PDU. In some embodiments, voltage is measured between an electrical output connection and ground. In some embodiments, voltage is measured across the shunt element. In some embodiments, the radial current splitter enables the individual and simultaneous measurements of respective load impedances coupled to electrical output connections of the PDU.

In some embodiments the radial current splitter is configured to split an aggregate current drawn through a PDU into two or more output currents receivable through electrical output connections, such as plugs or utility connections, included with the PDU. In some embodiments the PDU is configured to enable the selective control of whether or not current can be drawn from one or more electrical output connections of the PDU.

In some embodiments a system including the radial current splitter is configured to individually and/or simultaneously monitor one or more electrical output connections of a PDU. In some embodiments the system is configured to determine whether or not a load coupled to a respective one of the electrical output connections is no longer operating within a predetermined acceptable operating range. In some embodiments the PDU is configured to enable selective isolation of a load and control over whether or not the load receives current.

In some embodiments a PDU including the radial current splitter is configured to report measurements, taken individually and/or simultaneously, of one or more electrical output connections of the PDU. In some embodiments, the measurements are reported locally on a display connectable to and/or integrated with the PDU. In some embodiments, the PDU is configured to provide a signal to a remote monitoring device, system or computer program. Network adapters can also be coupled to each PDU to enable communication between multiple PDUs, data processing systems, remote printers, or storage devices through intervening private or public networks.

BRIEF DESCRIPTION OF THE DRAWINGS

FIG. 3A is a top view of a portion of the radial current splitter of FIG. 2A.

FIG. 3B is a bottom view of a portion of the radial current splitter of FIG. 2A.

FIG. 3C is a side view of a portion of the radial current splitter of FIG. 2A.

DETAILED DESCRIPTION

Figure 1:
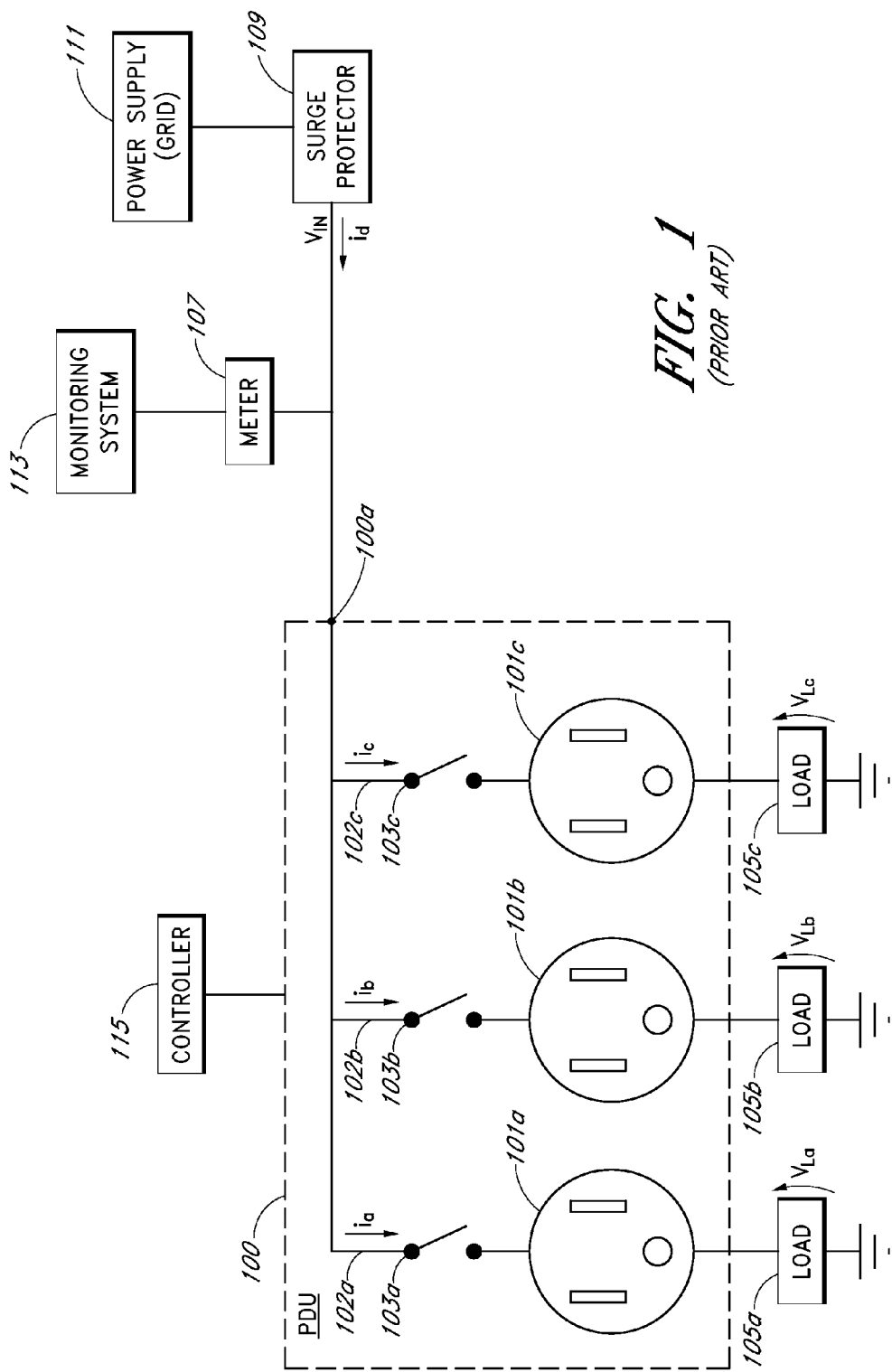
FIG. 1 is a schematic diagram of a conventional power distribution unit (PDU) shown with example associated devices and systems.

A surge, overload or short circuit caused by one of the devices coupled to a conventional power distribution unit (PDU) can blow a corresponding fuse or trip a corresponding circuit breaker located upstream from the PDU. Once the corresponding fuse blows or circuit breaker is tripped, the electricity to an entire distribution circuit can be abruptly cut off. Consequently, all of the server computers coupled to the distribution circuit, through the various corresponding PDUs, can be abruptly deprived of electricity and shutdown uncontrollably. Abruptly shutting down server computers or associated supporting devices can lead to a loss of data and damage to the software and/or hardware of the server computers or associated supporting devices.

The present disclosure describes a PDU configured to reduce the risk of an abrupt interruption in the flow of electricity caused by a malfunctioning load or overloading of a PDU output connection. In some embodiments, a PDU is configured to enable the monitoring and control of electricity provided to one or more loads coupled to the PDU. In some embodiments, a PDU is configured to enable remote monitoring and reporting through the use of communication devices.

Network adapters can also be coupled to the system to enable communication between multiple PDUs, data processing systems, remote printers, or storage devices through intervening private or public networks. Telephone Line Modems, Powerline modems, cable modems, Ethernet cards, wireless modems, and Bluetooth wireless transceivers are just a few of the currently available types of network adapters.

In some embodiments, a radial current splitter is configured to enable the individual and/or simultaneous measurement of one or more outputs of a PDU. In some embodiments, the radial current splitter substantially reduces the crosstalk within at least a portion of the PDU. In some embodiments, the radial current splitter enables the individual and/or simultaneous measurement of respective currents drawn from electrical output connections of a PDU. In some embodiments, the radial current splitter enables the individual and/or simultaneous measurement of the respective voltage levels at electrical output connections of the PDU. In some embodiments, the radial current splitter enables the individual and/or simultaneous measurements of respective load impedances coupled to electrical output connections of the PDU.

In some embodiments the radial current splitter is configured to split an aggregate current drawn through a PDU into two or more output currents receivable through electrical output connections, such as plugs or utility connections, included with the PDU. In some embodiments the PDU is configured to enable the selective control of whether or not current can be drawn from one or more electrical output connections of the PDU.

In some embodiments a system including the radial current splitter is configured to individually and/or simultaneously monitor one or more electrical output connections of a PDU. In some embodiments the system is configured to determine whether or not a load coupled to a respective one of the electrical output connections is no longer operating within a predetermined acceptable operating range. In some embodiments the PDU is configured to enable selective isolation of a load and control over whether or not the load receives current.

FIG. 1 is a schematic diagram of a conventional PDU 100. The conventional PDU 100 includes an electrical input connection 100a, three switches 103a, 103b, 103c, and three plugs (or utility connections) 101a, 101b, 101c. Each of the three switches 103a, 103b, 103c is respectively coupled to the electrical input connection 100a through corresponding wires or conductive strips 102a, 102b, 102c. Each of the three switches 103a, 103b, 103c is, in turn, selectively coupled to a corresponding one of the three plugs 101a, 101b, 101c, respectively.

FIG. 1 also includes example associated devices and systems that can be used in combination with the conventional PDU 100. To that end, FIG. 1 includes three loads 105a, 105b, 105c (e.g. server computers) coupled to the three corresponding plugs 101a, 101b, 101c, respectively. FIG. 1 also includes a controller 115, a surge protector 109, a power supply 111, a meter 107 and a monitoring system 113. The controller 115 is connectable to the conventional PDU 100 to control the operation of the three switches 103a, 103b, 103c. The power supply 111 is connected to the surge protector 109 which is in turn connected in series to the electrical input connection 100a of the conventional PDU 100. The monitoring system 113 is in communication with the meter 107. The meter 107 is in turn connected to the electrical input connection 100a of the conventional PDU 100.

In operation, the power supply 111 supplies electricity to the conventional PDU 100. If all of the switches 103a, 103b, 103c are closed, each of the loads 105a, 105b, 105c is able to draw a corresponding current $i_a$, $i_b$, $i_c$, respectively. The total or aggregate current drawn $i_d$ by the conventional PDU 100 is the sum of the currents drawn by each of the loads 105a, 105b, 105c. For example, if all of the switches 103a, 103b, 103c are closed, the loads 105a, 105b, 105c are able to draw respective currents $i_a$, $i_b$, $i_c$, and the aggregate current drawn $i_d$ through the conventional PDU 100 is sum of the currents $i_a$, $i_b$, and $i_c$. In contrast, for example, if switch 103a is open and switches 103b and 103c are closed the aggregate current drawn $i_d$ is the sum of currents $i_b$ and $i_c$. Moreover, each of the drawn currents $i_a$, $i_b$, $i_c$ is likely to be different from the others because each of the loads 105a, 105b, 105c is likely to have a corresponding equivalent input impedance that is different from at least some of the other loads. Assuming otherwise can lead to erroneous measurements.

The controller 115 controls whether or not the three switches are 103a, 103b, 103c open or closed. If one of the switches 103a, 103b, 103c is open, current cannot flow through to the corresponding one of the plugs 101a, 101b, 101c and to the one of the respective loads 105a, 105b, 105c.

The meter 107 measures either the voltage $V_{IN}$ or the aggregate current drawn $i_d$ or both at the electrical input connection 100a. The meter 107 then communicates measurements to the monitoring system 113. In some embodiments, the meter 107 is configured to measure at least one of voltage (in Volts or Volts RMS) current ($i_a$, $i_b$, $i_c$) (in Amps or Amps RMS), power (in Watts), reactive power (VAR), apparent power (VA), power factor, phase angle for one or more of the outlets, also.

In operation there is substantial crosstalk amongst the plugs 101a, 101b, 101c and the corresponding wires (or conductive strips) 102a, 102b, 102c. The crosstalk is caused by the combination of the alternating current travelling through the components of the conventional PDU 100 and the proximity of the components to one another within the conventional PDU 100. The crosstalk makes it difficult to measure the respective currents simultaneously drawn by the loads 105a, 105b, 105c. Moreover, the corresponding wires 102a, 102b and 102c are likely to have corresponding unequal parasitic resistance values caused by the physical layout.

One way of reliably measuring each respective current drawn by the loads 105a, 105b, 105c is to measure each current when all the other currents are zeroed through the conventional PDU 100. That is, the other loads connected to the conventional PDU 100 must be prevented from drawing respective currents through the conventional PDU 100. In a server cluster that means a number of server computers coupled to the same conventional PDU 100 need to be shutdown or abruptly denied electricity in order to measure the current drawn by a single server computer coupled to the same conventional PDU 100 as the others. This is not a practical method of measuring current drawn by individual server computers or associated supporting components. Thus, only the aggregate current drawn $i_d$ by the conventional PDU 100 can be accurately and practically measured within the conventional PDU 100.

The individual currents drawn $i_a$, $i_b$, $i_c$, can be measured by individually housed prior art measurement devices (not shown), such as for example current transformers coupled to the outlets 101a, 101b, 101c. Such a device for measuring one of the currents $i_a$, $i_b$, $i_c$ must be coupled between one of the PDU outlets 101a, 101b, 101c and one of the corresponding loads 105a, 105b, 105c. Such a device can only measure one outlet at a time. So in order to measure all the outlets together, a corresponding prior art measurement device, or amplifier feeding a multiplexed A/D or measurement device, will have to be provided at each outlet. This solution is both expensive and difficult to manage on a large scale, as within a server cluster.

Current transformers can also be integrated into a conventional PDU 100. However, the integration of an individual current transformer for each outlet of a conventional PDU 100 is expensive, and substantially adds to the weight and size of a conventional PDU 100. There are other challenges involved with trying to use a current transformer in combination with a conventional PDU. First, a current transformer is not typically linear over its full range, so gain and phase distortions must be compensated for by the measurement device. Resistive shunts are typically substantially more linear and cause little phase distortion. Second, current transformers often also have DC saturation issues, meaning that they do not accurately reflect the AC current when a DC current component is present. Third, current transformers cannot be used to measure DC current, whereas a resistive shunt can. Fourth, current transformers can be sensitive to magnetic and electromagnetic fields, which can skew the measurements.

Figure 2A:
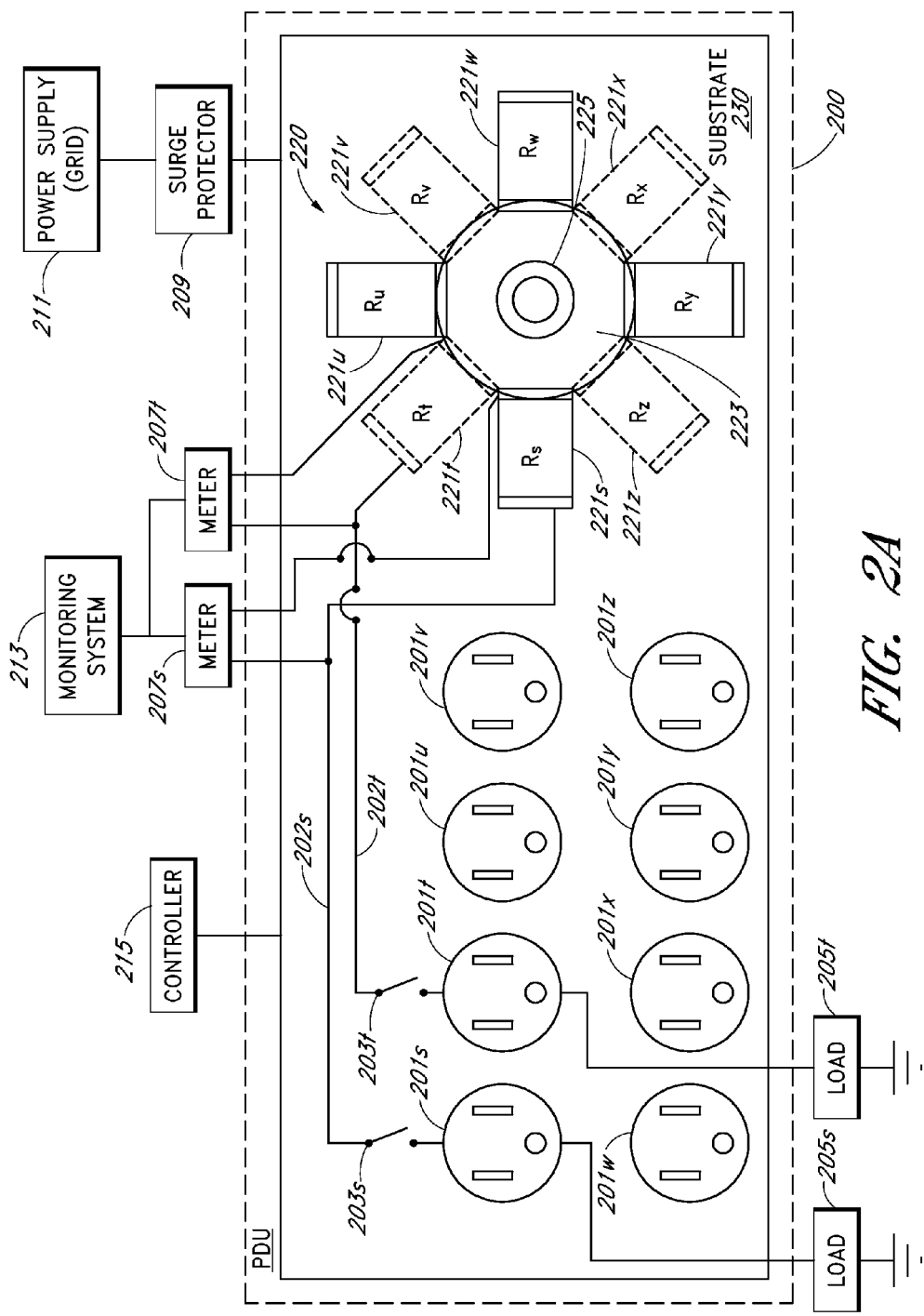
FIG. 2A is a schematic diagram of an embodiment of a radial current splitter included in an embodiment of a PDU shown with example associated devices and systems.

FIG. 2A is a schematic diagram of an embodiment of a radial current splitter 220 included in an embodiment of a PDU 200. In some embodiments, the PDU 200 includes a number of typically low cost components, which lowers the relative cost of the PDU 200. The PDU 200 includes a substrate 230, the radial current splitter 220 and eight plugs (or utility connections) 201s, 201t, 201u 201v, 201w, 201x, 201y, 201z, and a number of switches corresponding to the number of plugs. For the sake of simplicity, only two switches 203s and 203t are shown in FIG. 2. The PDU 200 also includes a number of wires or conductive strips corresponding to the number of plugs. For the sake of simplicity, only two conductive strips 202s and 202t are shown in FIG. 2.

While the PDU 200 of FIG. 2 includes eight plugs, those skilled in the art will appreciate from the present disclosure that an embodiment of a PDU can include any number of plugs (or other electrical output connections), and that the eight plugs shown are merely provided as an illustrative example. Also, even though each plug 201s, 201t, 201u 201v, 201w, 201x, 201y, 201z shown in FIG. 2 is described herein as being associated with a corresponding switch, those skilled in the art will appreciate from the present disclosure that an embodiment of a PDU can have more or less than one switch per plug (or electrical connection), and that one or more plugs can not be associated with a corresponding switch or combination of switches at all.

Figure 2B:
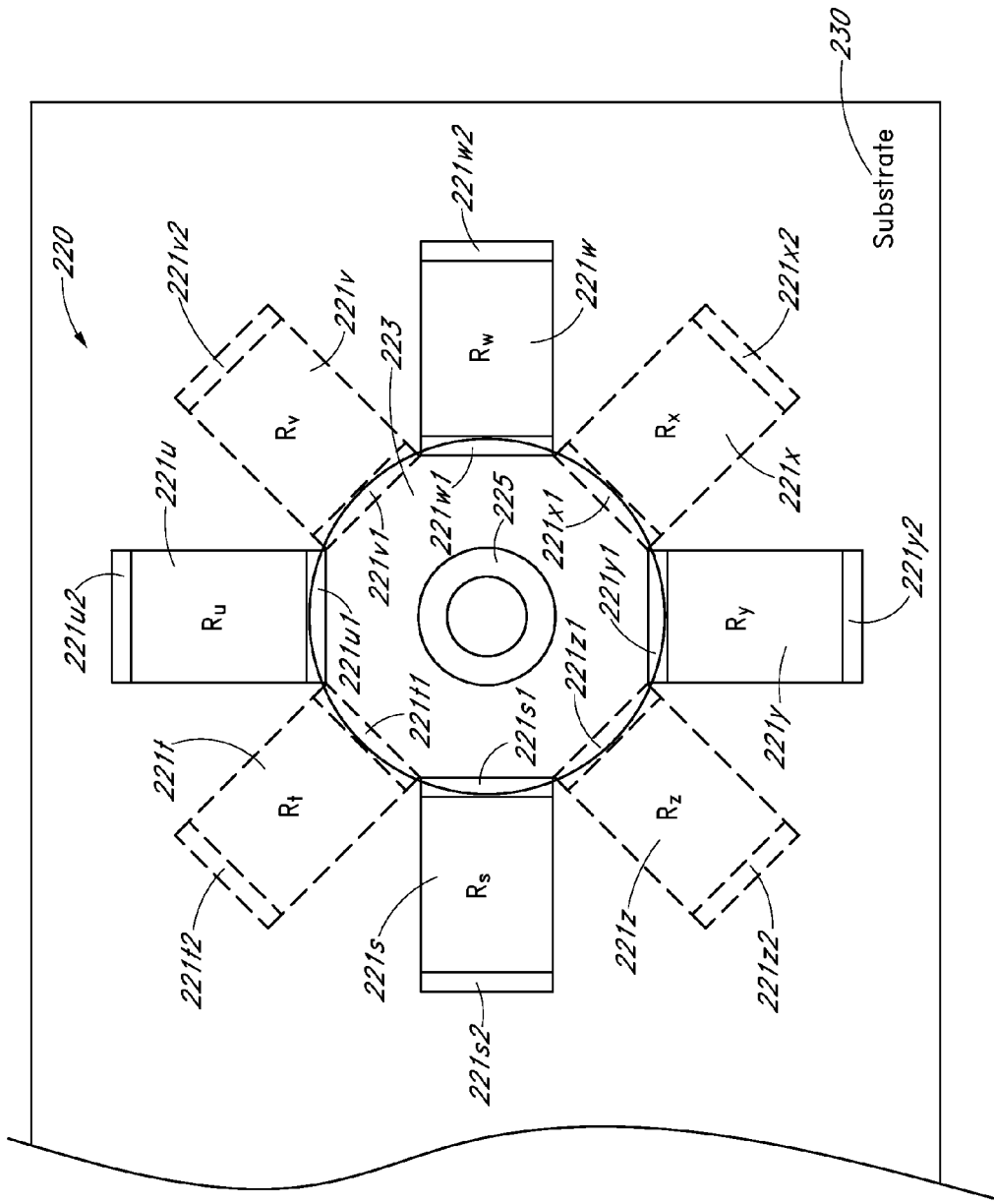
FIG. 2B is an isolated schematic diagram of the radial current splitter of FIG. 2A

Turning to FIG. 2B, with continued reference to FIG. 2A, shown is an isolated schematic view of an embodiment of the radial current splitter 220. The radial current splitter 220 includes a circular conductive core mountable within an aperture in the substrate 230. The circular conductive core includes a conductive disk 223 and a hollow conductive core 225 protruding through the center of the conductive disk 223. Those skilled in the art will appreciate from the present disclosure that the conductive core does not have to be hollow (or tubular) or a wholly separate component. In some embodiments, the conductive core is integrated with the conductive disk. In some embodiments, the conductive core and conductive disk are machined or formed from a single, solid, piece of copper (or alternative conductive metal or material). The arrangement of the conductive disk 223 and conductive core 225 is described in greater detailed below with reference to FIG. 3C and FIG. 4.

The radial current splitter 220 also includes eight resistive elements 221s, 221t, 221u, 221v, 221w, 221x, 221y, and 221z. In some embodiments, the resistive elements 221s, 221t, 221u, 221v, 221w, 221x, 221y, 221z are Manganin resistors. Manganin is an alloy primarily including copper, manganese and nickel, which is useful for manufacturing accurate resistors that remain stable for a long time and are useful for current measurement. Manganin resistors are often low cost components, which in turn, lowers the relative cost the radial current splitter 220 and ultimately the PDU 200. In some embodiments, the current splitter 220 includes shunt elements or a combination of elements useful for measuring power. In some embodiments, resistors made from Constantin are used.

Each resistive element 221s, 221t, 221u, 221v, 221w, 221x, 221y, 221z has a corresponding first electrical contact 221s1, 221t1, 221u1, 221v1, 221w1, 221x1, 221y1, 221z1, and corresponding second electrical contact 221s2, 221t2, 221u2, 221v2, 221w2, 221x2, 221y2, 221z2. The respective first electrical contacts 221s1, 221t1, 221u1, 221v1, 221w1, 221x1, 221y1, 221z1 are electrically coupled to the conductive disk 223, which is described in greater detail with reference to FIG. 4. The respective second electrical contacts are 221s2, 221t2, 221u2, 221v2, 221w2, 221x2, 221y2, 221z2 are electrically connectable to the corresponding respective plugs 201s, 201t, 201u, 201v, 201w, 201x, 201y, 201z through the respective conductive strips and switches (not all shown, as explained above). For example, the second electrical contact 221s2 is connectable to plug 201s through the respective conductive strip 202s and the corresponding switch 203s. Similarly, the second electrical contact 221t2 is connectable to plug 201t through the respective conductive strip 202 and the corresponding switch 203t.

Additionally, in some embodiments the resistive elements 221s, 221t, 221u, 221v, 221w, 221x, 221y, 221z are arranged so that adjacent resistive elements are not on the same side of the substrate 230. As indicated by the solid and dashed lines in FIGS. 2A and 2B, the resistive elements 221s, 221u, 221w, 221y are on one side of the substrate 230 and the resistive elements 221t, 221v, 221x, 221z are on the other side of the substrate 230. In some embodiments, connecting the resistive elements 221s, 221t, 221u, 221v, 221w, 221x, 221y, 221z in this manner simplifies construction and reduces crosstalk more than if the resistive elements 221s, 221t, 221u, 221v, 221w, 221x, 221y, 221z were all on the same side of the substrate.

Nevertheless, having the resistive elements 221s, 221t, 221u, 221v, 221w, 221x, 221y, 221z share the common connection of the conductive disk 223 alone allows for non-differential sensing of the currents flowing through each resistive element 221s, 221t, 221u, 221v, 221w, 221x, 221y, 221z. The substantially radial layout of the restive elements 221s, 221t, 221u, 221v, 221w, 221x, 221y, 221z around the conductive disk 223 create, in combination with the conductive disk 223 and conductive core 225, a desirable parasitic effect that leads to a reduction in electrical and electromagnetic crosstalk at least in close proximity to the radial current splitter 220. Furthermore, parasitic losses can be adjusted by adjusting the center thickness of the conductive disk 223.

Moreover, while the radial current splitter 220 includes eight resisters, those skilled in the art will appreciate from the present disclosure that an embodiment of a radial current splitter can include any number of resisters, and that the eight resisters shown are merely provided as an illustrative example.

FIG. 2A also includes example associated devices and systems that can be used in combination with the PDU 200. To that end, FIG. 2 includes two loads 205s, 205t (e.g. server computers) coupled to the corresponding plugs 201s, 201t, respectively. FIG. 2 also includes a controller 215, a surge protector 209, a power supply 211, two meters 207s, 207t and a monitoring system 213.

The controller 215 is connectable to the PDU 200 to control the operation of the switches, including switches 203s, 203t, shown as examples. The power supply 211 is connected to the surge protector 209 which is in turn connected in series to the electrical input connection 200a of the PDU 200.

The monitoring system 213 is in communication with the meters 207s, 207t. The meter 207s is connected across the resistive element 221s, and the meter 207t is similarly connected across the resistive element 221t. Moreover, while only two meters 207s, 207t are shown in FIG. 2, those skilled in the art will appreciate from the present disclosure that more or less than two meters can be used in combination with embodiments of the radial current splitter and embodiments of the PDU. In some embodiments, each meter is connectable across a particular one of the resistive elements, so that each meter can take measurements simultaneously. In some embodiments a meter is connectable across one or more of the resistive elements in order to take measurements across the one or more resistive elements simultaneously.

In operation, the power supply 211 supplies electricity to the PDU 200 through the circular conductive core of the radial current splitter 220. If all of the switches are closed, each of the loads is able to draw a corresponding current $i_s$, $i_t$, $i_u$, $i_v$, $i_w$, $i_x$, $i_y$, $i_z$, respectively. The total or aggregate current drawn $i_d$ by the PDU 200 is the sum of the currents drawn by each of the loads coupled to the PDU 200. For example, if all of the switches 203s, 207s, are the only closed switches, the loads 205s, 205t are able to draw respective currents $i_s$, $i_t$, and the aggregate current drawn $i_d$ through the PDU 200 is sum of the currents $i_s$ and $i_t$. Moreover, each of the drawn currents $i_s$, $i_t$, $i_u$, $i_v$, $i_w$, $i_x$, $i_y$, $i_z$ is likely to be different from the others because each of the loads is likely to have a corresponding equivalent input impedance that is different from at least some of the other loads.

The controller 215 controls whether or not each of the switches are open or closed. If one of the switches is open, current cannot flow through to the corresponding one of the plugs 201s, 201t, 201u 201v, 201w, 201x, 201y, 201z.

Each meter measures either the voltage $V_{IN}$, or the corresponding one of the currents drawn $i_s$, $i_t$, $i_v$, $i_w$, $i_x$, $i_y$, $i_z$ by loads coupled to the PDU 200, or the corresponding equivalent input impedance of a respective load, or a combination of all three measurements. Each meter can then communicate measurements to the monitoring system 211. For example, in operation, meters 207s, 207t shown in FIG. 2 can measure the corresponding currents $i_s$, $i_t$ drawn by the respective loads 205s, 205t.

Advantageously, in operation, the substantially radial layout of the restive elements 221s, 221t, 221u, 221v, 221w, 221x, 221y, 221z around the conductive disk 223 create, in combination with the conductive disk 223 and conductive core 225, a desirable parasitic effect that leads to a reduction in electrical and electromagnetic crosstalk at least in close proximity to the radial current splitter 220. The resulting reduction in crosstalk at least in close proximity to the radial current splitter 220 makes it possible for the meters (e.g. 207s and 207t) to accurately measure currents drawn by loads (e.g. 205s and 205t), coupled to the PDU 200, which was not practically possible using conventional PDUs. One possible method of monitoring one or more electrical outputs enabled by embodiments of the radial current splitter 220 and PDU 200 is discussed in greater detail below with reference to FIG. 5.

FIGS. 3A and 3B are respective top and bottom views of a portion of the radial current splitter 220 of FIG. 2A, and FIG. 3C is a side view of a portion of the current splitter 220 of FIG. 2A. While the descriptive terms "top", "bottom" and "side" are used to conveniently describe FIGS. 3A, 3B and 3C, those skilled in the art will appreciate from the present disclosure that these terms are not meant to restrict the orientation of the radial current splitter to any one particular embodiment.

With reference to FIGS. 3A, 3B and 3C, as introduced above, the radial current splitter 220 includes the conductive disk 223 and the conductive core 225 protruding through the center of the conductive disk 223. The conductive disk 223 has an outer diameter $d_1$ defining the conductive disk 223 and a diameter $d_2$ defining an aperture wall 223a substantially through the center of the conductive disk 223. The conductive disk 223 also has a width of w.

The conductive core 225 is divided into two portions, the first portion extending through and from the top surface of the conductive disk 223 and the second portion extending through and from the bottom portion of the conductive disk 223. The first portion of the conductive core 225 has an outer diameter $d_2$ and an inner diameter $d_3$. The second portion of the conductive core 225 has an outer diameter $d_2$ and an inner diameter $d_4$. In some embodiments, the inner diameter $d_3$ is larger than the inner diameter $d_4$. The first portion of the conductive core 225 has a length of $l_1$ from the conductive disk and the second portion has a length of $l_2$ from the conductive disk 223.

In one embodiment, the diameters $d_1$, $d_2$, $d_3$, $d_4$ are approximately about 0.375 inches, about 0.140 inches, about 0.090 inches, and about 0.060 inches, respectively.

Figure 4A:
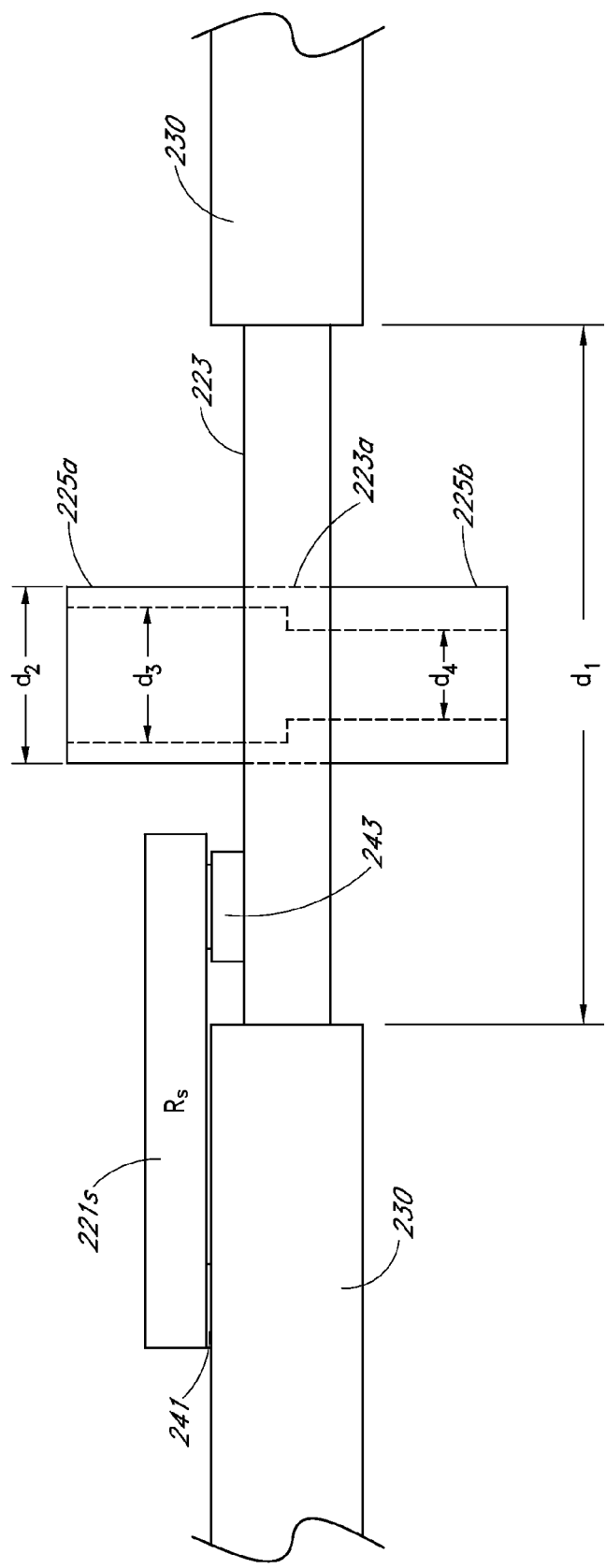
FIG. 4A is a side view of a portion of an embodiment of a radial current splitter.

FIG. 4A is a side schematic view of a portion of the radial current splitter 220 of FIG. 2A. Specifically, FIG. 4A shows one possible arrangement for the resistive elements 221s, 221t, 221u, 221v, 221w, 221x, 221y, 221z, the conductive disk 223 and conductive core 225 in relation to the substrate 230 of the PDU 200. For the sake of simplicity only one resistive element 221s (also marked as 'Rs') is illustrated in FIG. 4A. Those skilled in the art will appreciate from the present disclosure that the description provided herein would generally apply to the other resistive elements not shown.

As illustrated in FIG. 4A the conductive disk 223 is inserted into the substrate 230 so that the conductive core 225 extends through the substrate 230. The resistive element 221s is arranged so that it is substantially flat or parallel to the substrate 230. In this example, a conductive spacer 243 is provided because the conductive disk 223 is thinner than the substrate. As such the spacer 243 in combination with some solder 241 allows the resistive element to lie substantially parallel to the substrate 230.

The conductive spacer 243 is connected to the second connection 221s2 of the resistive element 221s. Those skilled in the art will appreciate that the conductive spacer 243 is a wholly optional feature. The resistive element 221s and the conductive spacer 243 are optionally held in place using solder 245 or the like.

Figure 4B:
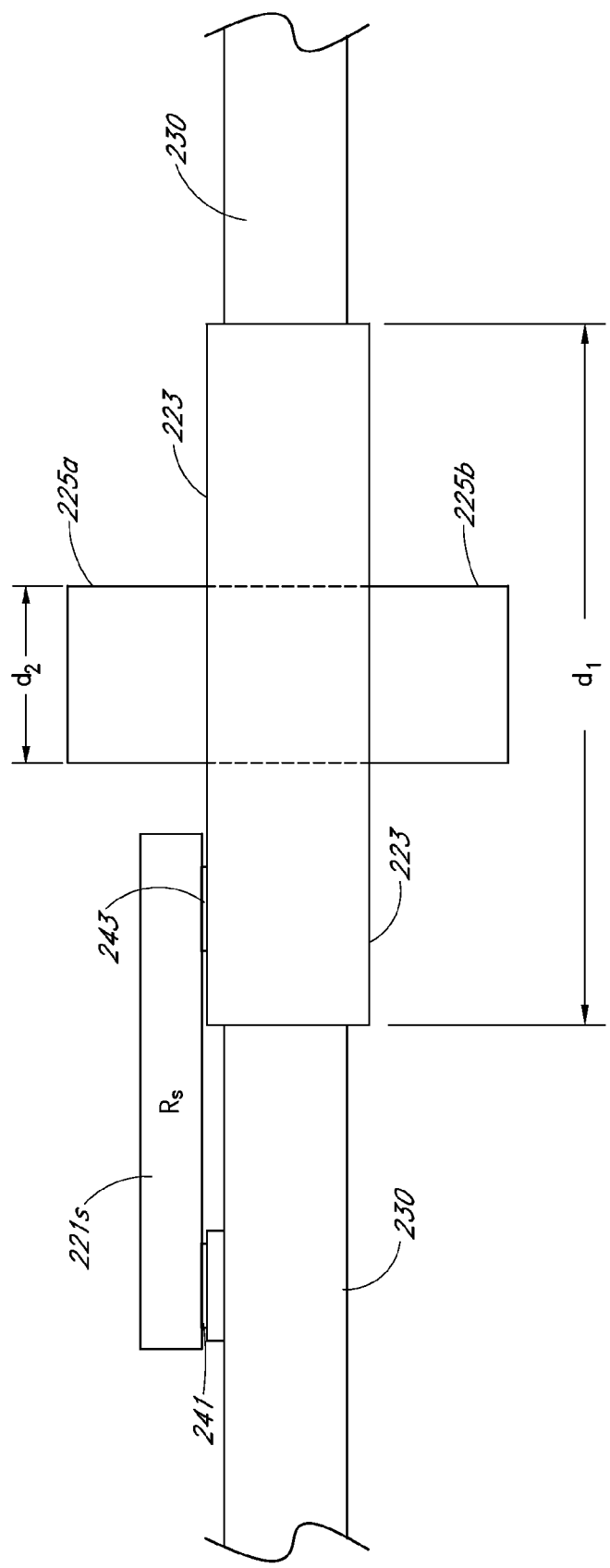
FIG. 4B is a side view of a portion of another embodiment of a radial current splitter.

FIG. 4B is a side schematic view of another portion of the radial current splitter 220 of FIG. 2A. Specifically, FIG. 4B shows one possible arrangement for the resistive elements 221s, 221t, 221u, 221v, 221w, 221x, 221y, 221z, the conductive disk 223 and conductive core 225 in relation to the substrate 230 of the PDU 200. For the sake of simplicity only one resistive element 221s (also marked as 'Rs') is illustrated in FIG. 4B.

In this embodiment, the conductive disk 223 is thicker than the substrate 230. Accordingly, a conductive spacer 241 is provided because the conductive disk 223 is thinner than the substrate. As such the spacer 241 in combination with some solder 243 allows the resistive element 221s to lie substantially parallel to the substrate 230.

The conductive spacer 241 is connected to the first connection 221s1 of the resistive element 221s. Those skilled in the art will appreciate that the conductive spacer 241 is a wholly optional feature. The resistive element 221s and the conductive spacer 241 are optionally held in place using solder 245 or the like.

Figure 4C:
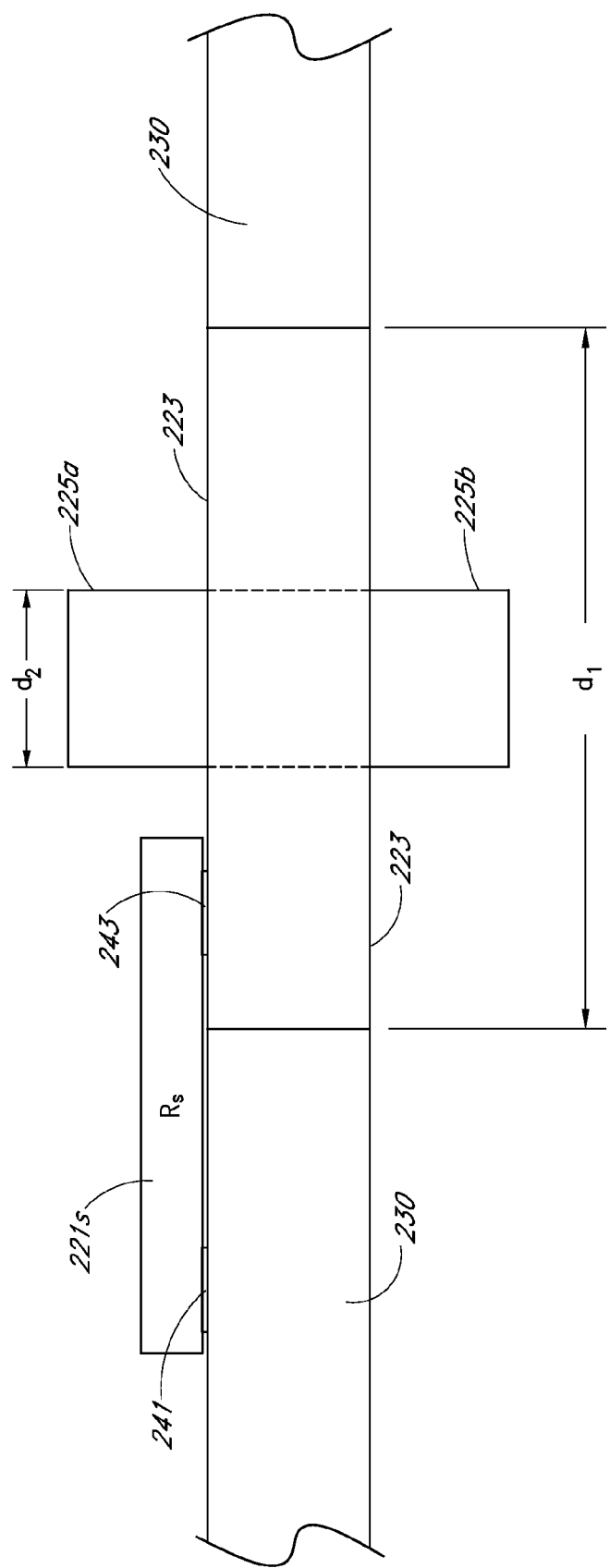
FIG. 4C is a side view of a portion of another embodiment of a radial current splitter.

FIG. 4C is a side schematic view of another portion of the radial current splitter 220 of FIG. 2A. Specifically, FIG. 4C shows one possible arrangement for the resistive elements 221s, 221t, 221u, 221v, 221w, 221x, 221y, 221z, the conductive disk 223 and conductive core 225 in relation to the substrate 230 of the PDU 200. For the sake of simplicity only one resistive element 221s (also marked as 'Rs') is illustrated in FIG. 4C. In this embodiment, the conductive disk 223 is approximately the same thickness as the substrate 230. Accordingly, conductive spacers are not required. As such, some solder 241, 243 on the respective first and second contacts 221s1 and 221s2 allows the resistive element 221s to lie substantially parallel to the substrate 230.

Figure 5A:
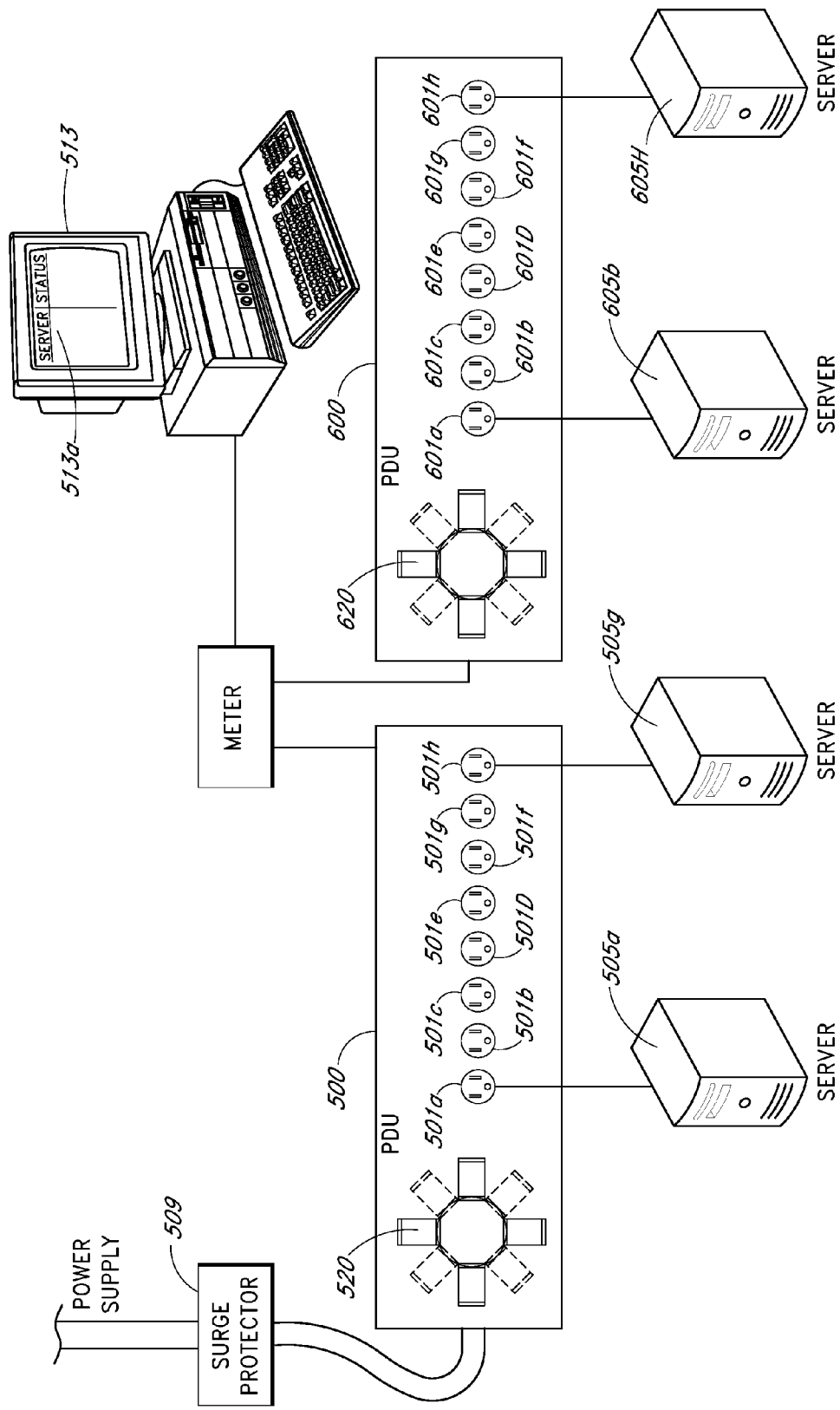
FIG. 5A is an embodiment of power monitoring and control system utilizing the radial current splitter of FIG. 2A.

FIG. 5A is an embodiment of power monitoring and control system utilizing the radial current splitter of FIG. 2A. The system includes first and second PDUs 500, 600. The PDU 500 has a radial current splitter 520 and eight electrical output connections (plugs or utility connections) 501a, 501b, 501c, 501d, 501e, 501f, 501g, 501h. The PDU 600 has a radial current splitter 620 and eight electrical output connections (plugs or utility connections) 601a, 601b, 601c, 601d, 601e, 601f, 601g, 601h.

Figure 5B:
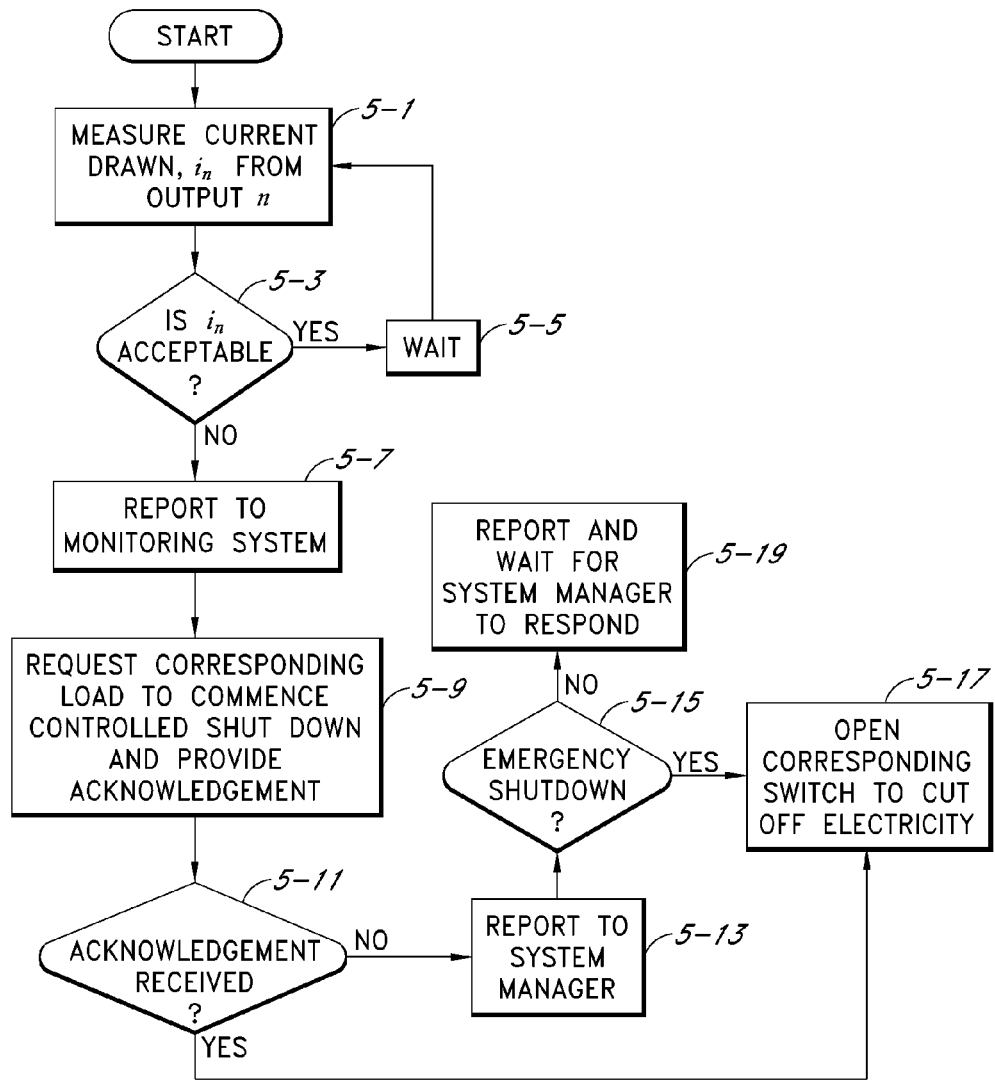
FIG. 5B is a flowchart illustrating an embodiment of a method of monitoring one or more electrical outputs enabled by an embodiment of a radial current splitter of FIG. 2A.

The system also includes four servers 505a, 505g, 605b, 605h, which are merely shown as an illustrative example to aid the description of the system. Those skilled in the art will appreciate from the present disclosure that any number of servers (or other loads) and any number of PDUs can be used in combination without departing from the scope of the claims. In the example of FIG. 5B, server 505a is coupled to electrical output 501a, server 505g is coupled to electrical output 501g, server 605b is coupled to electrical output 601b, and server 605h is coupled to electrical output 601h.

The system also includes a meter 507 and a monitoring system 513. The meter 507 is coupled to the various internal electrical connections of the PDUs 500, 600 provided by the corresponding radial current splitters 520, 620, respectively. The meter 507 is ultimately connected to the monitoring system 513 that includes a user display 513a.

The monitoring system 513 can be embodied in a number of forms. For example, various components can be embodied in a suitable combination of hardware, software and firmware. Some embodiments include, without limitation, entirely hardware, entirely software, entirely firmware or some suitable combination of hardware, software and firmware. In some embodiments, the invention is implemented in a combination of hardware and firmware, which includes, but is not limited to firmware, resident software, microcode, etc.

Some components of an embodiment can be embodied in the form of a computer program product that is accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by, or in connection with, the instruction execution system, apparatus, or device.

A computer-readable medium can be an electronic, magnetic, optical, electromagnetic, infrared, or semiconductor system (or apparatus or device) or a propagation medium. Examples of a computer-readable medium include a semiconductor and/or solid-state memory, magnetic tape, a removable computer diskette, a random access memory (RAM), a read-only memory (ROM), a rigid magnetic disk and an optical disk. Current examples of optical disks include, without limitation, compact disk—read only memory (CD-ROM), compact disk—read/write (CD-R/W) and DVD.

In some embodiments, a data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. In some embodiments, a data processing system suitable for storing and/or executing program code will include at least one processor integrated with memory elements through a system bus.

Input/output (i.e. I/O devices)—including but not limited to keyboards, touch-pads, displays, pointing devices, etc.—can be coupled to the system either directly or through intervening PO controllers.

Network adapters can also be coupled to the system to enable communication between multiple PDUs, data processing systems, remote printers, or storage devices through intervening private or public networks. Telephone Line Modems, Powerline modems, cable modems, Ethernet cards, wireless modems, and Bluetooth wireless transceivers are just a few of the currently available types of network adapters.

FIG. 5B is a flowchart illustrating one possible method of monitoring one or more electrical outputs enabled by an embodiment of a radial current splitter 220 of FIG. 2A. Starting at step 5-1, the method includes measuring the current drawn, $i_n$, from one of the electrical output connections, n, of the PDU 200.

Step 5-3 of the method includes determining whether or not the measured current $i_n$ (or other electrical parameter such as measured power) is acceptable. In some embodiments, determining whether or not the measured current is acceptable involves comparing the measured current to a threshold value. In some embodiments, determining whether or not the measured current is acceptable involves determining whether or not the measured current falls within an acceptable range. On the other hand, if the measured current is acceptable (yes path, step 5-3), the method proceeds to step 5-5 where the method includes a pause before the next measurement. In some embodiments, the pause is of a predetermined duration. In some embodiments, the pause is a pseudo-randomly or randomly selected duration.

If the measured current is not acceptable (no path, step 5-3), the method includes reporting to a monitoring system at step 5-7. At step 5-9, the method includes requesting the load drawing the measured current $i_n$ to commence a controlled shutdown (or power down) and provide an acknowledgment. In some embodiments, the system acknowledgement is optional. In some embodiments, a PDU controller operates to shut down a particular load. In some embodiments, approval may be needed.

Step 5-11 of the method includes determining whether or not an acknowledgement has been received from the load. If an acknowledgement has been received (yes path, step 5-11), the method includes opening a switch within the PDU corresponding to the electrical output connection coupled to the load at step 5-17. On the other hand, if an acknowledgement has not been received (no path, step 5-11), the method includes sending a report to a system manager at 5-13. In some embodiments the system manager is a device or software program configured to receive and respond to possibly failing loads coupled to embodiments of PDUs. In some embodiments, the system manager is a person who manually responds to possibly failing loads.

At step 5-15, the method includes determining whether or not an emergency shutdown is required. If an emergency shutdown is required (yes path, step 5-15), the method includes opening a switch within the PDU corresponding to the electrical output connection coupled to the load at step 5-17. On the other hand, if an emergency shutdown is not required (no path, step 5-15), the method includes reporting and waiting for a system manager to respond.

Figure 6A:
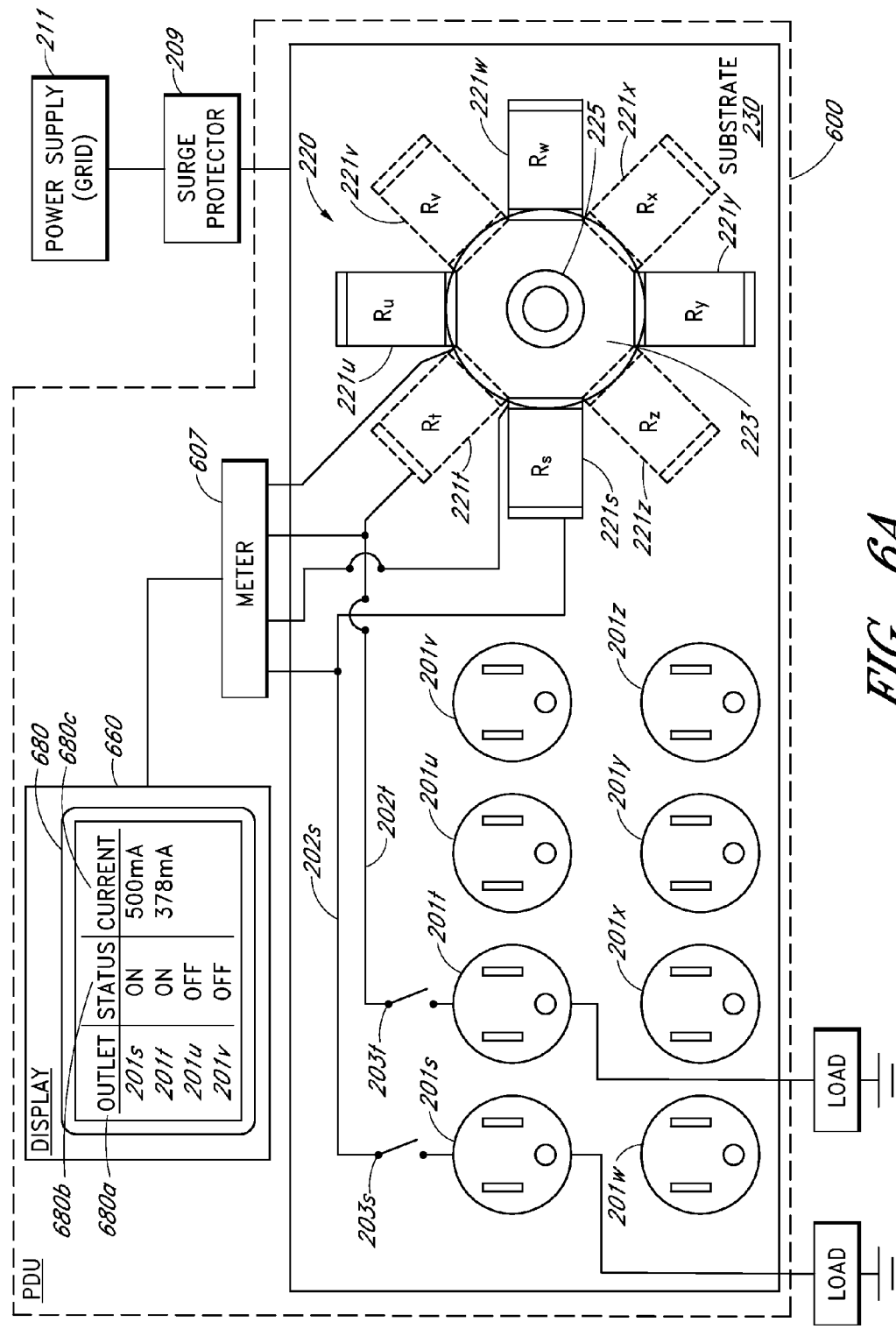
FIG. 6A is another embodiment of a PDU including a radial current splitter.

FIG. 6A is another embodiment of a PDU 600 including the radial current splitter 220. The PDU 600 illustrated in FIG. 6A is similar to and adapted from the PDU 200 illustrated in FIG. 2A. Accordingly, elements common to both PDUs 200 and 600 share common reference indicia, and only differences between the PDUs 200 and 600 are described herein for the sake of brevity.

The PDU 600 includes an internal meter 607 configured to take measurements across the one or more resistive elements 221s, 221t, 221u, 221v, 221w, 221x, 221y, and 221z, individually and/or simultaneously. For the sake of brevity, the meter 607 of FIG. 6A is only connected across two resistive elements 221s, 221t. However, those skilled in the art will appreciate from the present disclosure that the meter 607 can be connected across any combination of the resistive elements 221s, 221t, 221u, 221v, 221w, 221x, 221y, and 221z. Moreover, those skilled in the art will also understand that more than one internal meter can be used in combination with embodiments of the radial current splitter 220 and embodiments of the PDU. In some embodiments, each meter is connectable across a particular one of the resistive elements, so that each meter can take measurements simultaneously. In some embodiments a meter is connectable across one or more of the resistive elements in order to take measurements across the one or more resistive elements simultaneously.

The meter 607 is also connectable to an optional local display 660. The local display 660 is provided to display the measurements taken by the meter. In the example shown, the display provides a human-readable output 680. The human-readable output 680 is arranged into three columns 680a, 680b, 680c. The first column 680a lists the eight plugs (or utility connections) 201s, 201t, 201u 201v, 201w, 201x, 201y, 201z of the PDU 600. The second column 680b provides an indication as to whether or not each of the eight plugs (or utility connections) 201s, 201t, 201u 201v, 201w, 201x, 201y, 201z is in use. The third column 680c provides a measurement taken by the meter, such as for example a current measurement. Those skilled in the art will appreciate from the present disclosure that the arrangement of the display is shown in FIG. 6A is not meant to restrict the scope of the following claims, and that any suitable arrangement for the display can be employed to report the measurements taken.

In some embodiments, the meter 607 is additionally or alternatively connectable to a remote monitoring device, system or computer program (not shown) to which the meter 607 reports the measurements. Network adapters can also be coupled to the meter 607 to enable communication between multiple PDUs, data processing systems, remote printers, or storage devices through intervening private or public networks. Telephone Line Modems, Powerline modems, cable modems, Ethernet cards, wireless modems, and Bluetooth wireless transceivers are just a few of the currently available types of network adapters.

Figure 6B:
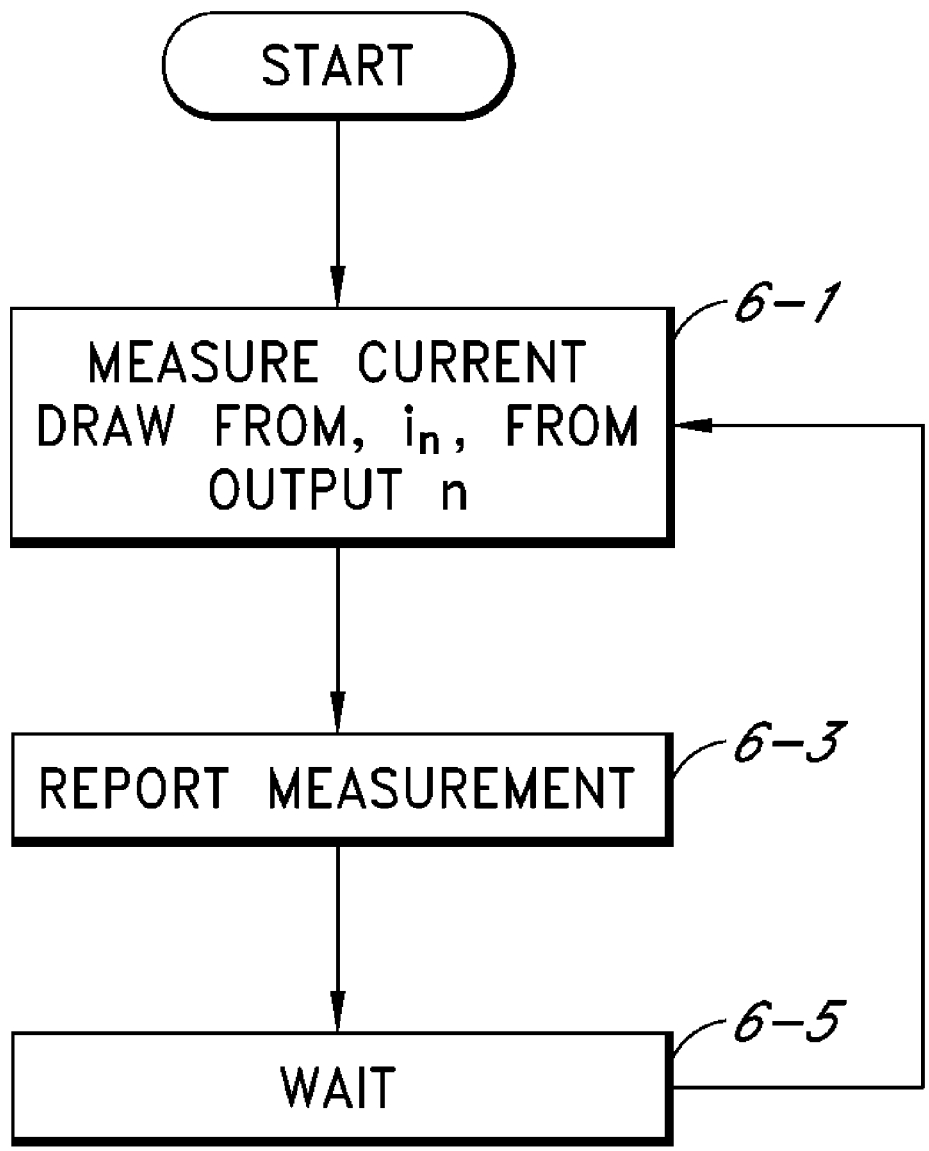
FIG. 6B is a flowchart illustrating an embodiment of a method of monitoring one or more electrical outputs and reporting measurements using the PDU of FIG. 6A.

FIG. 6B is a flowchart illustrating an embodiment of a method of monitoring one or more electrical outputs and reporting measurements using the PDU of FIG. 6A. Starting at step 6-1, the method includes measuring the current drawn, $i_n$, from one of the electrical output connections, n, of the PDU 600.

Step 6-3 of the method includes reporting the measurement of $i_n$. In some embodiments, the method includes reporting a collection of current measurements taken from a combination of outlets of the PDU 600. In some embodiments, reporting the measurement includes displaying the measurement on the local display 660. In some embodiments, reporting the measurement includes transmitting the measurement to a remote monitoring device, system or computer program.

At step 6-5 the method includes a pause before the next measurement. In some embodiments, the pause is of a predetermined duration. In some embodiments, the pause is a pseudo-randomly or randomly selected duration.

Although the foregoing invention has been described in terms of specific embodiments, other embodiments will be apparent to those of ordinary skill in the art from the disclosure herein. For example, a skilled artisan will recognize from the disclosure herein that various methods of manufacture, design, and materials can be used to make the various components described herein. For example, a person of ordinary skill in the art would understand any suitable number of resistive elements can be used in various embodiments of the radial current splitter. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the specific embodiments described above, but is to be defined by reference to the appended claims.

What is claimed is:

1. A radial current splitter configured to operate with a power distribution unit, and enable individual and simultaneous measurement of respective outputs of the power distribution unit, the radial current comprising:

a circular conductive core mountable within a first aperture in a substrate, the circular conductive core connectable to a power supply; and a plurality of resistive elements, each resistive element having respective first and second electrical contacts, the corresponding first electrical contact of each resistive element is coupled to the circular conductive core, wherein the plurality of resistive elements are arranged around the circular conductive core to create a desirable parasitic effect in operation that leads to a reduction in crosstalk at least in close proximity to the radial current splitter.

2. The radial current splitter of claim 1, wherein the circular conductive core comprises:

a conductive disk having two substantially flat sides and an aperture wall defining a second aperture that is substantially centrally located through the two flat sides of the conductive disk; and a conductive core connectable through the aperture in the conductive disk, the conductive core having first and second portions, the first portion extending from one of the flat sides of the conductive disk, and the second portion extending from the other one of the flat sides of the conductive disk.

3. The radial current splitter of claim 2, wherein the first portion of the conductive core has an inner diameter that is larger than the diameter of the second portion.

4. The radial current splitter of claim 2, wherein the first and second portions of the conductive core extend above opposite sides of the substrate.

5. The radial current splitter of claim 1 further comprising a corresponding plurality of spacers respectively placed between the corresponding first electrical contact of each resistive element and the circular conductive core.

6. The radial current splitter of claim 1, wherein electrically adjacent resistive elements are connectable to opposite sides of the circular conductive core.

7. The radial current splitter of claim 1, wherein the corresponding second electrical contact of each resistive element is arranged to contact a conductor on the substrate.

8. The radial current splitter of claim 1, wherein the circular core comprises:

a conductive disk having two substantially flat sides and an aperture wall defining a second aperture that is substantially centrally located through the two flat sides of the conductive disk; and a conductive core integral with the aperture in the conductive disk, the conductive core having first and second portions, the first portion extending from one of the flat sides of the conductive disk, and the second portion extending from the other one of the flat sides of the conductive disk.

9. A power distribution unit (PDU) configured to provide measurement contacts from which an electrical output provided to individual loads coupled to the PDU in operation can be individually and/or simultaneously measured, the PDU comprising:

a substrate with a first aperture wall defining a first aperture;

a radial current splitter connectable to a power supply, the radial current splitter having a circular conductive core mountable within the first aperture in the substrate, and a plurality of resistive elements, wherein the plurality of resistive elements are arranged around the circular conductive core to create a desirable parasitic effect in operation that leads to a reduction in crosstalk; and a plurality of electrical output connections respectively coupled to the corresponding plurality of resistive elements.

10. The PDU of claim 9, wherein each resistive element has respective first and second electrical contacts, the corresponding first electrical contact of each resistive element is coupled to the circular conductive core, wherein the first and second electrical contacts are connectable to a measurement device.

11. The PDU of claim 10 further comprising a corresponding plurality of controllable switches connectable in series between the respective plurality of restive elements and the corresponding plurality of electrical output connections.

12. The PDU of claim 9, wherein the circular conductive core comprises:

a conductive disk having two substantially flat sides and a second aperture wall defining a second aperture that is substantially centrally located through the two flat sides of the conductive disk; and a conductive core connectable through the second aperture of the conductive disk, the conductive core having first and second portions, the first portion extending from one of the flat sides of the conductive disk, and the second portion extending from the other one of the flat sides of the conductive disk.

13. The PDU of claim 12, wherein the first portion of the conductive core has an inner diameter that is larger than the diameter of the second portion.

14. The PDU of claim 12, wherein the first and second portions of the conductive core extend above opposite sides of the substrate.

15. The PDU of claim 9 further comprising a corresponding plurality of spacers respectively placed between the corresponding first electrical contact of each resistive element and the circular conductive core.

16. The PDU of claim 9, wherein electrically adjacent resistive elements are connectable to opposite sides of the circular conductive core.

17. The PDU of claim 9, wherein the corresponding second electrical contact of each resistive element is arranged to contact a conductor on the substrate.

18. A power control system comprising:

a power distribution unit (PDU) having a radial current splitter connectable to a power supply, the radial current splitter having a circular conductive core mountable within a first aperture in a substrate, and a plurality of resistive elements, wherein the plurality of resistive elements are arranged around the circular conductive core to create a desirable parasitic effect in operation that leads to a reduction in crosstalk;

at least one meter connectable across one or more of the resistive elements to measure a electrical output at one end of each of the one or more resistive element, wherein in operation the at least one meter provides measurements as an output; and a system monitor connectable to receive measurements from the at least one meter.

19. A radial current splitter configured to operate with a power distribution unit, and enable individual and simultaneous measurement of respective outputs of the power distribution unit, the radial current comprising:

a circular conductive core mountable within a first aperture in a substrate, the circular conductive core connectable to a power supply; and a plurality of shunt elements suitable for measuring power, each shunt element having respective first and second electrical contacts, the corresponding first electrical contact of each shunt element is coupled to the circular conductive core, wherein the plurality of shunt elements are arranged around the circular conductive core to create a desirable parasitic effect in operation that leads to a reduction in crosstalk at least in close proximity to the radial current splitter.

* * * * *

UNITED STATES PATENT AND TRADEMARK OFFICE
CERTIFICATE OF CORRECTION

PATENT NO. : 8,368,379 B2
APPLICATION NO. : 12/717851
DATED : February 5, 2013
INVENTOR(S) : David Richard Gruetter et al.

It is certified that error appears in the above-identified patent and that said Letters Patent is hereby corrected as shown below:

In the Drawings:
Sheet 8 of 11, Fig. 5A    Delete "605H" and insert --605h--

In the Specifications:
Column 6, Line 26    After "cost", insert --of--
Column 6, Line 49    Delete "202" and insert --202$t$--
Column 7, Line 1    Delete "221 $t$" and insert --221$t$--
Column 7, Line 19    Delete "FIG. 2" and insert --FIG. 2A--
Column 7, Line 21    Delete "FIG. 2" and insert --FIG. 2A--
Column 7, Line 50    Delete "207$s$" and insert --203$t$--
Column 7, Line 63    After "$i_t$," insert -- $i_u$,--
Column 7, Line 67    Delete "211" and insert --213--
Column 8, Line 1    Delete "FIG. 2" and insert --FIG. 2A--
Column 9, Line 9    Delete "245" and insert --241--
Column 9, Line 28    Delete "245" and insert --241--
Column 9, Line 58    Delete "5B" and insert --5A--
Column 9, Line 60    Delete "501$g$" and insert --501$h$--
Column 9, Line 60    Delete "601$b$" and insert --601$a$--
Column 10, Line 45    Delete "PO" and insert --I/O--
Column 12, Line 7    After "display", delete "is"

Signed and Sealed this
Twenty-second Day of October, 2013

Teresa Stanek Rea
*Deputy Director of the United States Patent and Trademark Office*